US011348869B2

(12) United States Patent
Chen et al.

(10) Patent No.: US 11,348,869 B2
(45) Date of Patent: May 31, 2022

(54) METHOD OF MANUFACTURING CHIP PACKAGING STRUCTURE

(71) Applicant: Unimicron Technology Corp., Taoyuan (TW)

(72) Inventors: Chien-Chou Chen, Hsinchu County (TW); Chun-Hsien Chien, New Taipei (TW); Wen-Liang Yeh, Taoyuan (TW); Wei-Ti Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/100,932

(22) Filed: Nov. 22, 2020

(65) Prior Publication Data

US 2021/0074633 A1    Mar. 11, 2021

Related U.S. Application Data

(62) Division of application No. 16/231,365, filed on Dec. 21, 2018, now Pat. No. 10,879,167.

(30) Foreign Application Priority Data

Nov. 7, 2018  (TW) .................................. 107139547

(51) Int. Cl.
*H01L 23/04* (2006.01)
*H01L 23/522* (2006.01)
(Continued)

(52) U.S. Cl.
CPC .......... *H01L 23/5226* (2013.01); *H01L 21/50* (2013.01); *H01L 23/04* (2013.01);
(Continued)

(58) Field of Classification Search
CPC ..... H01L 23/5226; H01L 23/04; H01L 24/09; H01L 24/17; H01L 24/73;
(Continued)

(56) References Cited

U.S. PATENT DOCUMENTS

2015/0348912 A1* 12/2015 Su .......................... H01L 21/563
257/666
2016/0359221 A1   12/2016 Chih et al.
(Continued)

FOREIGN PATENT DOCUMENTS

CN       103855458 A     6/2014
CN       106486422 A     3/2017
(Continued)

*Primary Examiner* — Timor Karimy
(74) *Attorney, Agent, or Firm* — CKC & Partners Co., LLC

(57) ABSTRACT

A chip packaging structure includes a circuit redistribution structure, a chip, a sealing layer, and an antenna pattern. The circuit redistribution structure includes a first and a second circuit layer, and a conductive pad. The second circuit layer is disposed on and electrically connected to the first circuit layer. The conductive pad is electrically connected to the second circuit layer. The chip is disposed on the circuit redistribution structure and electrically connected to the second circuit layer. The sealing layer having an opening and a groove covers the chip and the circuit redistribution structure. The opening exposes the conductive pad. A portion of the groove communicates with the opening. The antenna pattern includes a first and a second portion. The first portion covers sidewalls of the opening and is electrically connected to the conductive pad. The second portion is filled in the groove and electrically connected to the first portion.

7 Claims, 12 Drawing Sheets

(51) Int. Cl.
*H01L 23/00* (2006.01)
*H01L 21/50* (2006.01)
(52) U.S. Cl.
CPC .............. *H01L 24/09* (2013.01); *H01L 24/17* (2013.01); *H01L 24/73* (2013.01); *H01L 2224/0231* (2013.01); *H01L 2224/02331* (2013.01); *H01L 2224/02373* (2013.01); *H01L 2224/02381* (2013.01)
(58) Field of Classification Search
CPC ... H01L 2224/0231; H01L 2224/02331; H01L 2224/02373; H01L 2224/02381; H01L 21/50
See application file for complete search history.

(56) References Cited

U.S. PATENT DOCUMENTS

| | | | |
|---|---|---|---|
| 2018/0053735 A1* | 2/2018 | Ueda | H01Q 9/0485 |
| 2019/0006309 A1* | 1/2019 | Jeng | H01L 24/19 |

FOREIGN PATENT DOCUMENTS

| | | |
|---|---|---|
| CN | 107039405 A | 8/2017 |
| JP | 2014179821 A | 9/2014 |

* cited by examiner

METHOD OF MANUFACTURING CHIP PACKAGING STRUCTURE

CROSS-REFERENCE TO RELATED APPLICATION

This application is a Divisional of U.S. application Ser. No. 16/231,365, filed on Dec. 21, 2018, which claims priority of Taiwan Application Serial Number 107139547, filed Nov. 7, 2018, the entirety of which is incorporated by references herein in their entireties.

BACKGROUND

Field of Invention

The present disclosure relates to a chip packaging structure and a method of manufacturing a chip packaging structure.

Description of Related Art

Conventionally, an antenna pattern is placed on the sealing layer to enhance signal strength. However, an etching process and an electroplating process are usually required to form the antenna pattern, and therefore the cost is high. In addition, the antenna pattern protrudes from the top surface of the sealing layer, and therefore it is disadvantageous for thinning electronic devices.

SUMMARY

One aspect of the present disclosure is to provide a chip packaging structure. The chip packaging structure includes a circuit redistribution structure, a chip, a sealing layer, and an antenna pattern. The circuit redistribution structure includes a first circuit redistribution layer, a second circuit redistribution layer, and a conductive pad. The first circuit redistribution layer includes a first circuit layer. The second circuit redistribution layer is disposed on the first circuit redistribution layer and includes a second circuit layer electrically connected to the first circuit layer. The conductive pad is electrically connected to the second circuit layer. The chip is disposed on the circuit redistribution structure and electrically connected to the second circuit layer. The sealing layer covers the chip and the circuit redistribution structure. The sealing layer has an opening and a groove. The opening exposes the conductive pad, and a portion of the groove communicates with the opening. The antenna pattern includes a first portion and a second portion. The first portion covers sidewalls of the opening and is electrically connected to the conductive pad. The second portion is filled in the groove and electrically connected to the first portion.

In some embodiments of the present disclosure, a top surface of the second portion of the antenna pattern is coplanar with a top surface of the sealing layer.

In some embodiments of the present disclosure, the chip packaging structure further includes a protecting substrate disposed under the circuit redistribution structure.

Another aspect of the present disclosure is to provide a chip packaging structure. The chip packaging structure includes a circuit redistribution structure, a chip, a sealing layer, and an antenna pattern. The circuit redistribution structure includes a first circuit redistribution layer and a second circuit redistribution layer. The first circuit redistribution layer includes a first circuit layer. The second circuit redistribution layer is disposed on the first circuit redistribution layer and includes a second circuit layer electrically connected to the first circuit layer. The chip is disposed over the circuit redistribution structure and electrically connected to the second circuit layer. The sealing layer covers the chip and the circuit redistribution structure, and the sealing layer has an opening. The antenna pattern includes a first portion and a second portion. The first portion is disposed on the circuit redistribution structure and covered by the sealing layer. The first portion is electrically connected to the second circuit layer, and the opening exposes the first portion. The second portion covers sidewalls of the opening and is electrically connected to the first portion.

In some embodiments of the present disclosure, the chip packaging structure further includes a protecting substrate disposed under the circuit redistribution structure.

In some embodiments of the present disclosure, the sealing layer further includes a groove, in which a portion of the groove communicates with the opening. The antenna pattern further includes a third portion. The third portion is filled in the groove and electrically connected to the second portion.

In some embodiments of the present disclosure, a top surface of the third portion of the antenna pattern is coplanar with a top surface of the sealing layer.

In some embodiments of the present disclosure, the opening is a trench or a through hole.

Yet another aspect of the present disclosure is to provide a chip packaging structure. The chip packaging structure includes a protecting substrate, a circuit redistribution structure, a chip, a sealing layer, and an antenna pattern. The circuit redistribution structure has a first opening and is disposed on the protecting substrate. The circuit redistribution structure includes a first circuit redistribution layer and a second circuit redistribution layer. The first circuit redistribution layer includes a first circuit layer. The second circuit redistribution layer is disposed on the first circuit redistribution layer and includes a second circuit layer electrically connected to the first circuit layer. The chip is disposed over the circuit redistribution structure and electrically connected to the second circuit layer. The sealing layer covers the chip and the circuit redistribution structure. The sealing layer has a second opening communicating with the first opening. The antenna pattern includes a first portion and a second portion. The first portion is disposed over the protecting substrate and covered by the circuit redistribution structure. The first portion is electrically connected to the second circuit layer and exposes the first portion. The second portion covers sidewalls of the first opening and sidewalls of the second opening. The second portion is electrically connected to the first portion.

Yet another aspect of the present disclosure is to provide a method of manufacturing a chip packaging structure. The method includes steps of (i) providing a formed body, in which the formed body includes a circuit redistribution structure and a chip disposed over the circuit redistribution structure. The circuit redistribution structure includes a first circuit redistribution layer, a second circuit redistribution layer, and a conductive pad. The first circuit redistribution layer includes a first circuit layer, while the second circuit redistribution layer is disposed on the first circuit redistribution layer and includes a second circuit layer electrically connected to the first circuit layer and the chip. The conductive pad is electrically connected to the second circuit layer; (ii) forming a sealing material covering the chip and the circuit redistribution structure; (iii) patterning the sealing material to form a sealing layer, in which the sealing layer has an opening and a groove, the opening exposes the conductive pad, and a portion of the groove communicates with the opening; and (iv) forming an antenna pattern, in which the antenna pattern includes: a first portion covering sidewalls of the opening and electrically connecting with the conductive pad; and a second portion filling in the groove and electrically connecting with the first portion.

In some embodiments of the present disclosure, the step (iii) is performed by a laser direct structuring process.

Yet another aspect of the present disclosure is to provide a method of manufacturing a chip packaging structure. The method includes steps of (i) providing a formed body, in which the formed body includes a circuit redistribution structure and a chip disposed over the circuit redistribution structure. The circuit redistribution structure includes a first circuit redistribution layer and a second circuit redistribution layer. The first circuit redistribution layer includes a first circuit layer, while the second circuit redistribution layer is disposed on the first circuit redistribution layer and includes a second circuit layer electrically connected to the first circuit layer and the chip; (ii) forming a first portion of an antenna pattern on the circuit redistribution structure; (iii) forming a sealing material covering the first portion of the antenna pattern, the chip, and the circuit redistribution structure; (iv) patterning the sealing material to form a sealing layer, in which the sealing layer has an opening exposing the first portion of the antenna pattern; and (v) forming a second portion of the antenna pattern on sidewalls of the opening, in which the second portion is electrically connected to the first portion.

In some embodiments of the present disclosure, the step (iii) is performed by a laser direct structuring process.

In some embodiments of the present disclosure, the sealing layer in step (iv) further includes a groove, a portion of the groove communicates with the opening; in which the step (v) further includes forming a third portion of the antenna pattern in the groove, the third portion is electrically connected to the second portion.

Yet another aspect of the present disclosure is to provide a method of manufacturing a chip packaging structure. The method includes steps of (i) providing a formed body, in which the formed body includes a protecting substrate, a first portion of an antenna pattern disposed over the protecting substrate, a circuit redistribution precursor structure disposed on the protecting substrate, and a chip disposed over the circuit redistribution precursor structure. The circuit redistribution precursor structure includes a first circuit layer and a second circuit layer. The second circuit layer is disposed on the first circuit layer and electrically connected to the first circuit layer, the first portion of the antenna pattern, and the chip; (ii) forming a sealing material covering the chip and the circuit redistribution precursor structure; (iii) patterning the circuit redistribution precursor structure and the sealing material to form a circuit redistribution structure and a sealing layer, in which the circuit redistribution structure has a first opening exposing the first portion of the antenna pattern, and the sealing layer has a second opening communicating with the first opening; and (iv) forming a second portion of the antenna pattern on sidewalls of the first opening and sidewalls of the second opening, in which the second portion is electrically connected to the first portion.

In some embodiments of the present disclosure, the step (iii) is performed by a laser direct structuring process.

It is to be understood that both the foregoing general description and the following detailed description are by examples, and are intended to provide further explanation of the invention as claimed.

DETAILED DESCRIPTION

Figure 1A:
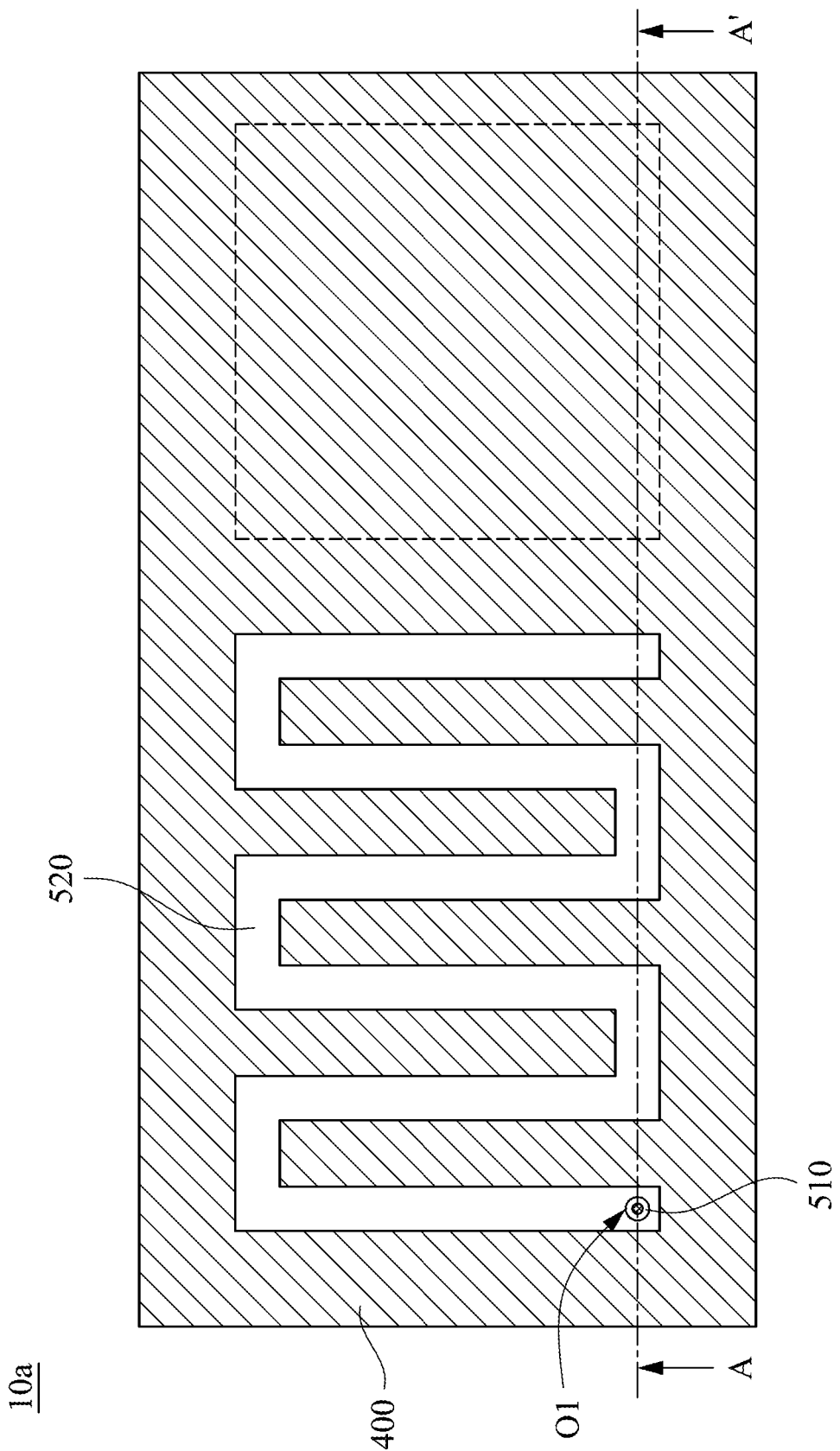
FIG. 1A is a schematic top view of a chip packaging structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below may be combined or substituted with each other in an advantageous situation, and other embodiments may be added to an embodiment without further description or explanation. In the following description, many specific details will be described in detail. The details are to enable the reader to understand the following embodiments fully. However, the embodiments of the present disclosure may be practiced without such specific details.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "below," "over," "above," etc., are used to facilitate the description of the relative relationship between one element or feature and another element or feature shown in the figure. The actual meaning of the spatially relative terms includes other orientations. For example, when the diagram is flipped upside down by 180 degrees, the relationship between one element and another element may change from "under" or "below" to "over" or "above." In addition, the relative spatially relationship in this description should be interpreted in the same way.

Figure 1B:
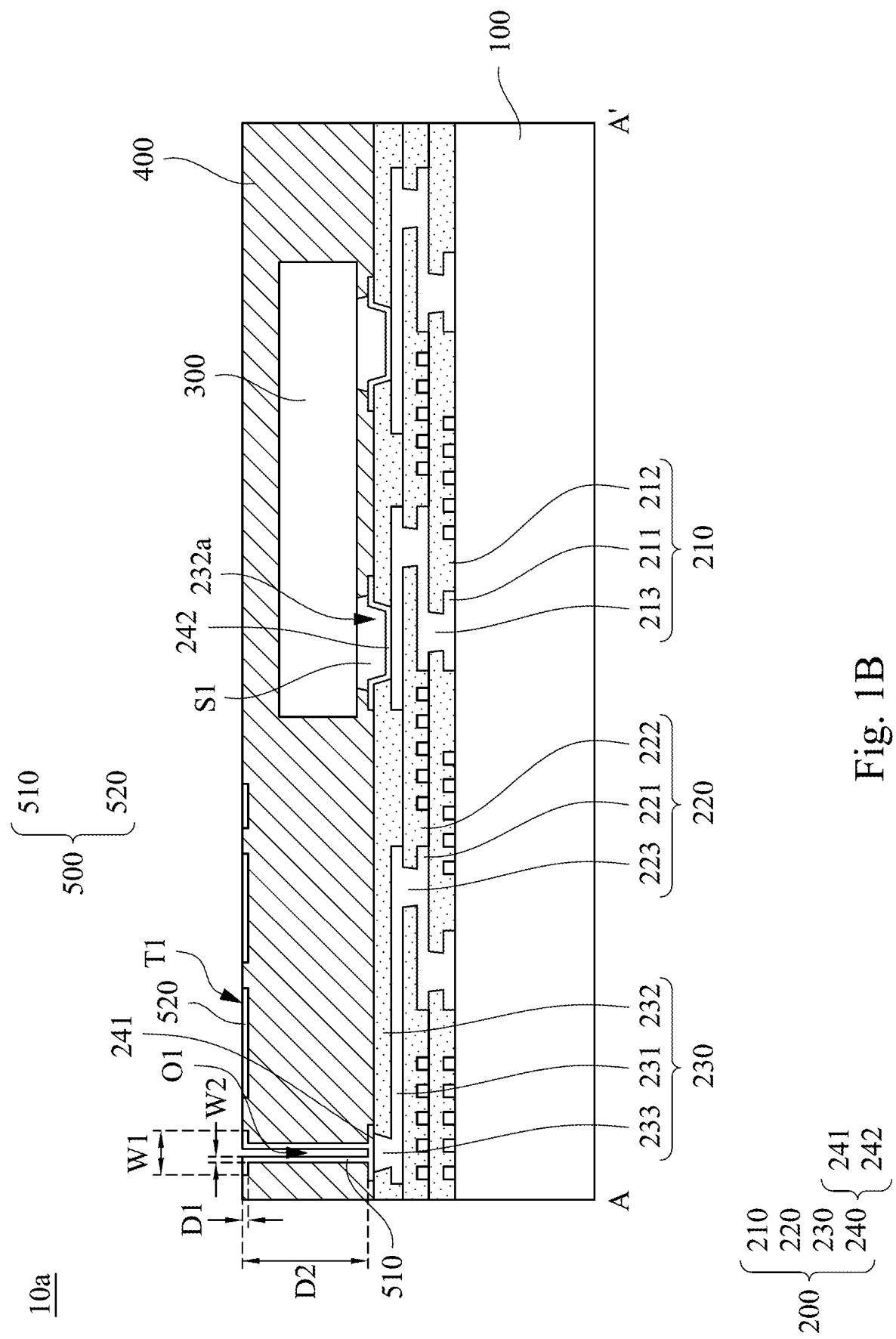
FIG. 1B is a schematic sectional view along a cutting line A-A' of FIG. 1A.

FIG. 1A depicts a schematic top view of a chip packaging structure 10a according to one embodiment of the present disclosure. FIG. 1B depicts a schematic sectional view of the chip packaging structure 10a of FIG. 1A along a cutting line A-A'. As shown in FIG. 1A and FIG. 1B, the chip packaging structure 10a includes a protecting substrate 100, a circuit redistribution structure 200, a chip 300, a sealing layer 400, and an antenna pattern 500.

The circuit redistribution structure 200 is disposed on the protecting substrate 100 and includes a first circuit redistribution layer 210, a second circuit redistribution layer 220, a third circuit redistribution layer 230, and a conductive pad 240. Specifically, the first circuit redistribution layer 210 includes a first circuit layer 211, a first dielectric layer 212, and a first conductive contact member 213. The first circuit layer 211 and the first conductive contact member 213 are embedded in the first dielectric layer 212. In detail, a bottom surface of the first circuit layer 211 is coplanar with a bottom surface of the first dielectric layer 212. The first conductive contact member 213 is in contact with the first circuit layer 211, and a top surface of the first conductive contact member 213 is exposed outside the first dielectric layer 212. In some examples, the first circuit layer 211 may include any conductive material, such as copper, nickel, silver, or any metal of the like. In some examples, the first dielectric layer 212 includes ABF (Ajinomoto Build-up Film), polyimide (PI), or a photoimageable dielectric material (PID). In some examples, the first conductive contact member 213 may be a metal pillar made of a conductive metal, such as copper, nickel, or silver.

The second circuit redistribution layer 220 is disposed on the first circuit redistribution layer 210. Specifically, the second circuit redistribution layer 220 includes a second circuit layer 221, a second dielectric layer 222, and a second conductive contact member 223. The second circuit layer 221 and the second conductive contact member 223 are embedded in the second dielectric layer 222. In detail, the second circuit layer 221 is in contact with an exposed portion of the first conductive contact member 213, such that the second circuit layer 221 is electrically connected to the first circuit layer 211. A bottom surface of the second circuit layer 221 is coplanar with a bottom surface of the second dielectric layer 222. The second conductive contact member 223 is in contact with the second circuit layer 221, and a top surface of the second conductive contact member 223 is exposed outside the second dielectric layer 222. In some examples, the second circuit layer 221 may include any conductive material, such as copper, nickel, silver, or any metal of the like. In some examples, the second dielectric layer 222 includes ABF, polyimide (PI), or a photoimageable dielectric material (PID). In some examples, the second conductive contact member 223 may be a metal pillar made of a conductive metal, such as copper, nickel, or silver.

The third circuit redistribution layer 230 is disposed on the second circuit redistribution layer 220. Specifically, the third circuit redistribution layer 230 includes a third circuit layer 231, a third dielectric layer 232, and a third conductive contact member 233. The third circuit layer 231 and the third conductive contact member 233 are embedded in the third dielectric layer 232. In detail, the third circuit layer 231 is in contact with an exposed portion of the second conductive contact member 223, such that the third circuit layer 231 is electrically connected to the second circuit layer 221. A bottom surface of the third circuit layer 231 is coplanar with a bottom surface of the third dielectric layer 232. The third conductive contact member 233 is in contact with the third circuit layer 231, and a top surface of the third conductive contact member 233 is exposed outside the third dielectric layer 232. Moreover, the third dielectric layer 232 has a first opening 232a exposing a portion of the third circuit layer 231. In some examples, the third circuit layer 231 may include any conductive material, such as copper, nickel, silver, or any metal of the like. In some examples, the third dielectric layer 232 includes ABF, polyimide (PI), or a photoimageable dielectric material (PID). In some examples, the third conductive contact member 233 may be a metal pillar made of a conductive metal, such as copper, nickel, or silver.

The conductive pad 240 includes a first conductive pad 241 and a second conductive pad 242. The first conductive pad 241 is disposed on the third circuit redistribution layer 230. Specifically, the first conductive pad 241 is in contact with an exposed portion of the third conductive contact member 233, such that the first conductive pad 241 is electrically connected to the third circuit layer 231. In some examples, the first conductive pad 241 may include any conductive material, such as copper, nickel, silver, or any metal of the like.

The second conductive pad 242 covers a portion of the third dielectric layer 232, sidewalls of the first opening 232a, and an exposed portion of the third circuit layer 231. In detail, the second conductive pad 242 is conformal with the first opening 232a, such that the second conductive pad 242 defines an opening having a shape that is substantially the same with that of the first opening 232a. In some examples, the second conductive pad 242 may include any conductive material, such as copper, nickel, silver, or any metal of the like.

The chip 300 is disposed over the third circuit redistribution layer 230 and electrically connected to the third circuit layer 231. Specifically, a plurality of metal bumps (not shown) is disposed on a bottom surface of the chip 300, and the metal bumps are bonded to the second conductive pad 242 through a soldering material S1, such that the chip 300 is electrically connected to the third circuit layer 231. As described above, the second conductive pad 242 defines the opening having a shape that is substantially the same with that of the first opening 232a. It is noted that the opening provides some technical effects. Specifically, a bottom of the soldering material S1 is embedded in the opening, such that the soldering material S1 can be stably fixed on the second conductive pad 242 and therefore is not prone to peeling off. In some examples, the soldering material S1 includes a tin ball.

The sealing layer 400 covers the chip 300 and the circuit redistribution structure 200. Specifically, the sealing layer 400 has a second opening O1 and a groove T1. In some examples, the second opening O1 is a through hole (as shown in FIG. 1A). The second opening O1 exposes the first conductive pad 241, and a portion of the groove T1 communicates with the second opening O1. As shown in FIG. 1B, a depth D1 of the groove T1 may range from 0.2-3 µm, while a depth D2 of the second opening O1 may range from 5-150 µm. In some examples, the sealing layer 400 includes an insulating material, and it is noted that the insulating material includes a plurality of catalyst particles dispersed therein (not shown). The catalyst particles may be metal particles. The catalyst particles provide some technical effects, which will be described below in detail.

The antenna pattern 500 includes a first portion 510 and a second portion 520. The first portion 510 covers the sidewalls of the second opening O1 and is electrically connected to the first conductive pad 241. Specifically, a bottom of the first portion 510 is in contact with the first conductive pad 241. A width W2 of the first portion 510 may range from 0.2-3 µm. The second portion 520 is filled in the groove T1 and electrically connected to the first portion 510. Specifically, the second portion 520 is in contact with a top of the first portion 510, while a top surface of the second portion 520 is coplanar with a top surface of the sealing layer 400. Therefore, the antenna pattern 500 is not exposed outside of the top surface of the sealing layer 400, and therefore it is advantageous for thinning of electronic devices. A width W1 of the second portion 520 may range from 5-100 µm. In some examples, the antenna pattern 500 includes a metal, such as copper, nickel, or silver, but is not limited thereto.

The present disclosure also provides a method of manufacturing the chip packaging structure 10a.

First, a formed body is provided. The formed body includes a protecting substrate 100, a circuit redistribution structure 200 disposed on the protecting substrate 100, and a chip disposed over the circuit redistribution structure. In detail, the first circuit layer 211 is formed on the protecting substrate 100. For example, a conductive material is formed on the protecting substrate 100, and the conductive material is patterned to form the first circuit layer 211. In some examples, the conductive material is formed by an electroplating process, a chemical vapor deposition process, a physical vapor deposition process, or the like, but is not limited thereto. Next, a first dielectric layer 212 is formed and covers the first circuit layer 211. The first dielectric layer 212 includes at least one via that exposes a portion of the first circuit layer 211. For example, a dielectric material is formed and covers the first circuit layer 211, and the dielectric material is patterned to form the via. In some examples, the dielectric material is formed by chemical vapor deposition, physical vapor deposition, or the like, but is not limited thereto. The conductive material and the dielectric material may be patterned by depositing a photoresist on a layer that is to be patterned, followed by exposing and developing the photoresist to form a patterned photoresist layer. Next, the patterned photoresist layer is used as an etching mask when the layer that is to be patterned is etched. Finally, the patterned photoresist layer is removed. Alternatively, in an example where the dielectric material serves as a photoimageable dielectric material, a portion of the photoimageable dielectric material is removed by an exposure and etching process, such that the photoimageable dielectric material is patterned.

Next, a second circuit layer 221 is formed on the first dielectric layer 212, and a first conductive contact member 213 is formed in the via of the first dielectric layer 212. For example, a conductive material is formed on the first dielectric layer 212 and filled in the via of the first dielectric layer 212. Subsequently, the conductive material is patterned to form the second circuit layer 221 and the first conductive contact member 213. Then, a second dielectric layer 222, a third circuit layer 231, and a second conductive contact member 223 are formed by processes similar to that of forming the first dielectric layer 212, the second circuit layer 221, and the first conductive contact member 213.

Next, a third dielectric layer 232 is formed and covers the third circuit layer 231 and the second dielectric layer 222. The third dielectric layer 232 includes at least one via and at least one first opening 232 that exposes a portion of the third circuit layer 231. For example, a dielectric material is formed and covers the third circuit layer 231 and the second dielectric layer 222, and the dielectric material is patterned to form the via and the first opening 232a.

Subsequently, a third conductive contact member 233 is formed in the via of the third dielectric layer 232, a first conductive pad 241 is formed and covers the third conductive contact member 233, and a second conductive pad 242 is formed and covers a portion of the third dielectric layer 23, sidewalls of the first opening 232a, and the exposed portion of the third circuit layer 231. For example, a conductive material is formed and covers the third dielectric layer 232, and the conductive material is filled in the first opening 232a and the via of the third dielectric layer 232. Then, the conductive material is patterned to form the third conductive contact member 233, the first conductive pad 241, and the second conductive pad 242. Consequently, the circuit redistribution structure 200 is formed on the protecting substrate 100.

Then, a chip 300 is disposed over the circuit redistribution structure 200. Specifically, a plurality of metal bumps (not shown) on a bottom surface of the chip 300 is bonded to the second conductive pad 242 by using a soldering material S1.

Next, a sealing material is formed and covers the chip 300 and the circuit redistribution structure 200. Subsequently, the sealing material is patterned to form the sealing layer 400. Specifically, at least one second openings O1 and at least one groove T1 of the first conductive pad 241 are exposed after patterning the sealing material by a laser direct structuring process. It is noted that the sealing material includes a plurality of catalyst particles dispersed therein, and the catalyst particles may be exposed after the sealing material is patterned. As described above, the catalyst particles provide some technical effects. Specifically, the catalyst particles that are exposed after the sealing material is patterned may absorb laser energy, such that the catalyst particles may be "activated." In this way, the "activated" catalyst particles may serve as seeds, and a metal material can be directly deposited in the groove T1 and on the sidewalls of the second opening O1 by a chemical deposition process.

Subsequently, an antenna pattern 500 is formed. Specifically, a first portion 510 of the antenna pattern 500 is formed by a chemical deposition process, in which the first portion 510 covers the sidewalls of the second opening O1. A second portion 520 of the antenna pattern 500 is formed and filled the groove T1. Since the "activated" catalyst particles are exposed from the second opening O1 and the groove T1, such that after the chemical deposition process, the metal material is deposited in the groove T1 and is also deposited on the sidewalls of the second opening O1. It is noted that in the method of manufacturing the chip packaging structure 10a as described herein, an etching process and an electroplating process are not required during the formation of the antenna pattern, thereby reducing manufacturing costs.

Figure 2A:
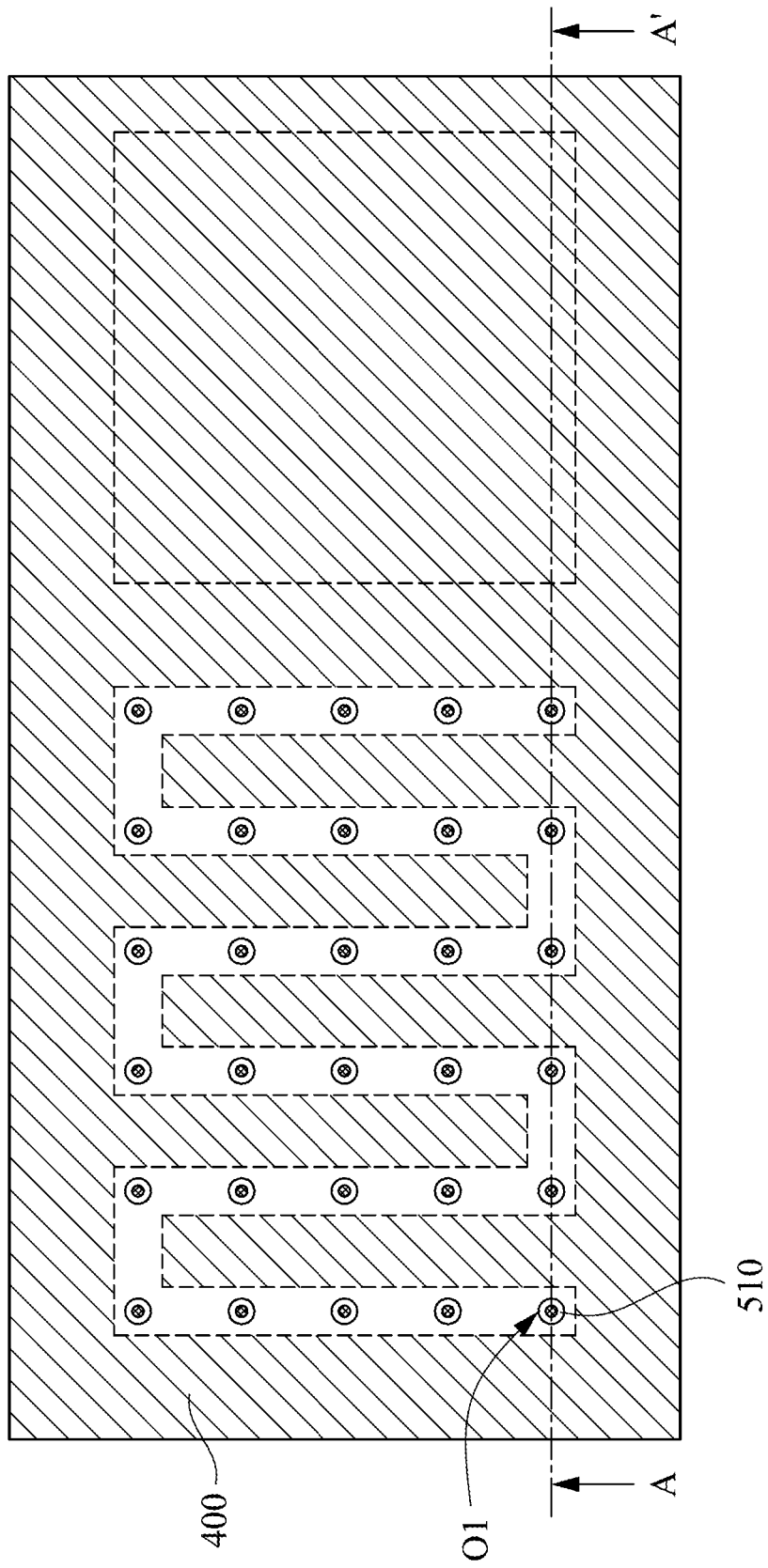
FIG. 2A is a schematic top view of a chip packaging structure according to one embodiment of the present disclosure.
Figure 2B:
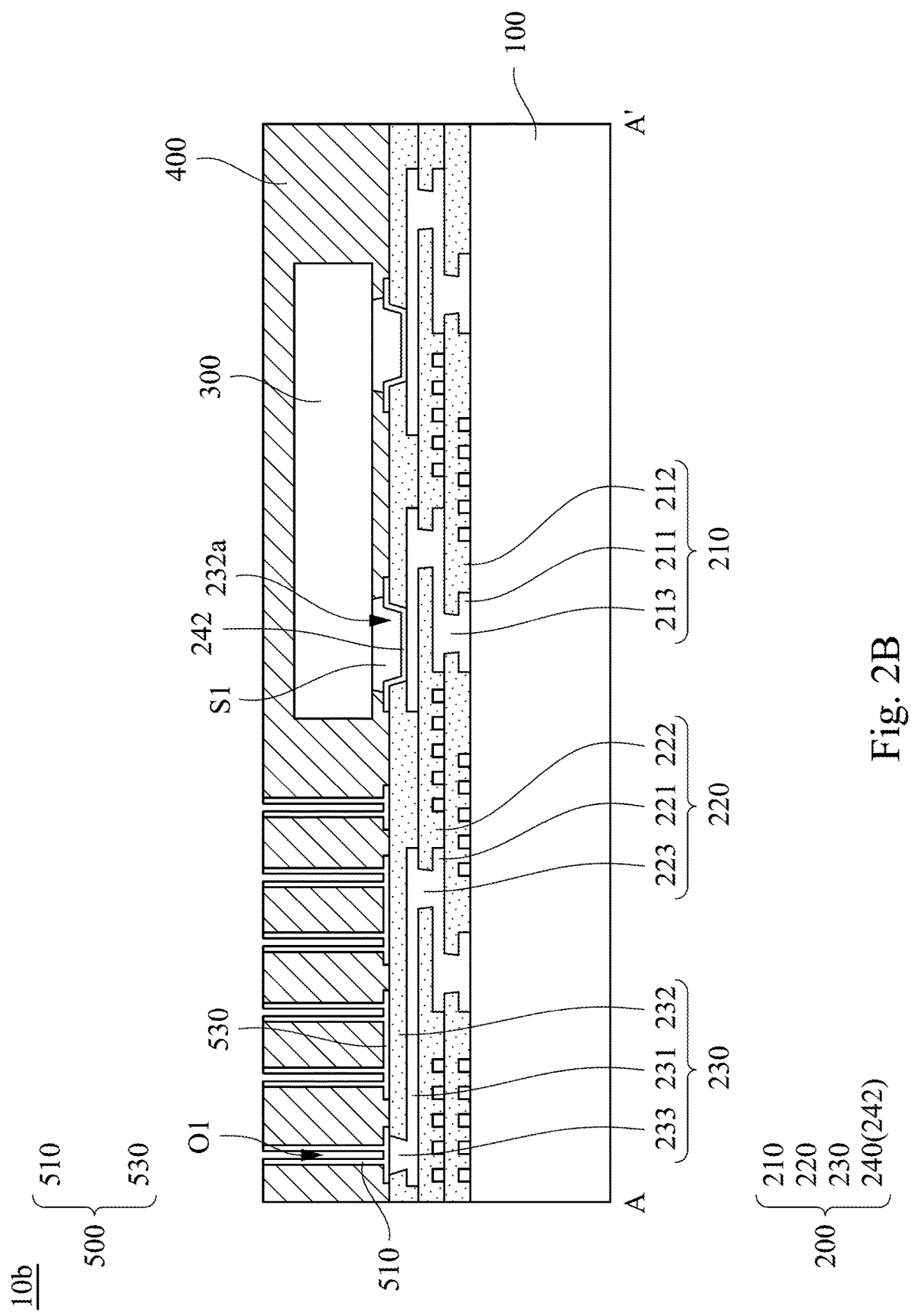
FIG. 2B is a schematic sectional view along a cutting line A-A' of FIG. 2A.

FIG. 2A depicts a schematic top view of a chip packaging structure 10b according to one embodiment of the present disclosure. FIG. 2B depicts a schematic sectional view of the chip packaging structure 10b along a cutting line A-A' in FIG. 2A. It is noted that in FIG. 2A and FIG. 2B, the same or similar elements as those in FIG. 1A and FIG. 1B are given the same symbols, and the related description is omitted. The chip packaging structure 10b in FIG. 2A and FIG. 2B is similar to the chip packaging structure 10a in FIG. 1A and FIG. 1B, and differences between them include a sealing layer 400 of the chip packaging structure 10b having no groove and an antenna pattern 500 of the chip packaging structure 10b having no portion filled in a groove.

In addition, the antenna pattern 500 of the chip packaging structure 10b further includes a first portion 530, and the first portion 530 replaces the first conductive pad 241 in the chip packaging structure 10a. Specifically, the first portion 530 of the antenna pattern 500 is disposed on the third circuit redistribution layer 230 and is covered by the sealing layer 400. The first portion 530 is in contact with an exposed portion of the third conductive contact member 233, such that the first portion 530 is electrically connected to the third circuit layer 231. Moreover, the second portion 510 covers the sidewalls of the second opening O1 and is electrically connected to the first portion 530. In detail, a bottom of the second portion 510 is in contact with the first portion 530.

It is noted that as shown in FIG. 2A, the second opening O1 is a through hole, and the chip packaging structure 10b may have a plurality of through hole. Consequently, an area of the second portion 510 of the antenna pattern 500 that is formed on the sidewalls of the through hole is increased. Therefore, the signal strength is increased.

The present disclosure also provides a method of manufacturing the chip packaging structure 10b. The difference between the methods of manufacturing the chip packaging structure 10a in FIGS. 1A-1B and manufacturing the chip packaging structure 10b includes forming a first portion 530 of an antenna pattern 500 on a third conductive contact member 233 and a third dielectric layer 232 after a third dielectric layer 232 is formed, in addition to the formation of the third conductive contact member 233 and the second conductive pad 242. For example, a conductive material is formed and covers the third dielectric layer 232. The conductive material is also filled in the first opening 232a and the via of the third dielectric layer 232. Next, the conductive material is patterned to form the third conductive contact member 233, a first portion 530 of the antenna pattern 500m and a second conductive pad 242.

Moreover, only the second opening O1 of the first portion 530 of the antenna pattern 500 is formed by a laser process of direct formation. Accordingly, after a chemical deposition process, a metal material is deposited on sidewalls of the second opening O1, such that a second portion 510 of the antenna pattern 500 is formed.

Figure 3A:
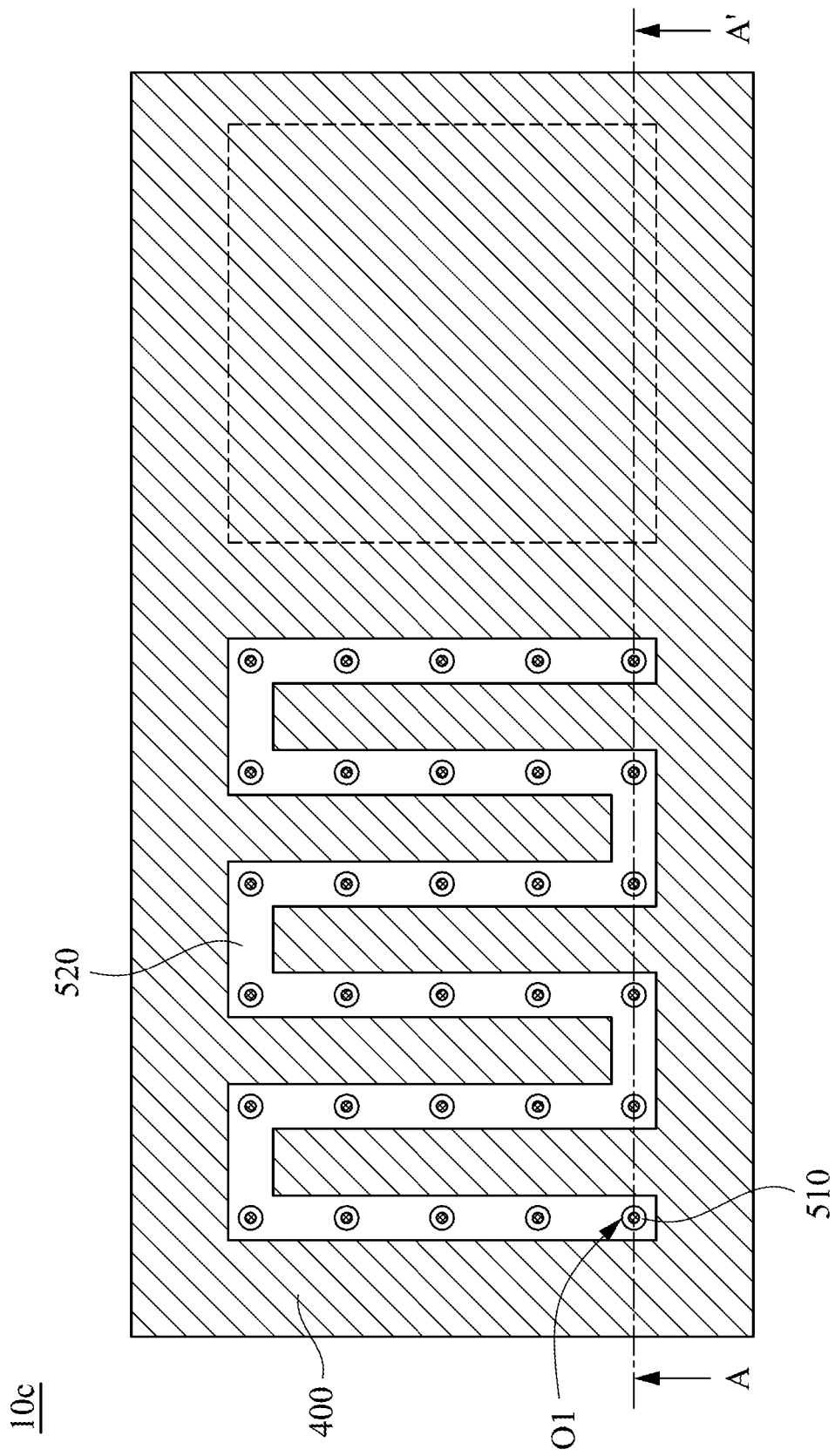
FIG. 3A is a schematic top view of a chip packaging structure according to one embodiment of the present disclosure.
Figure 3B:
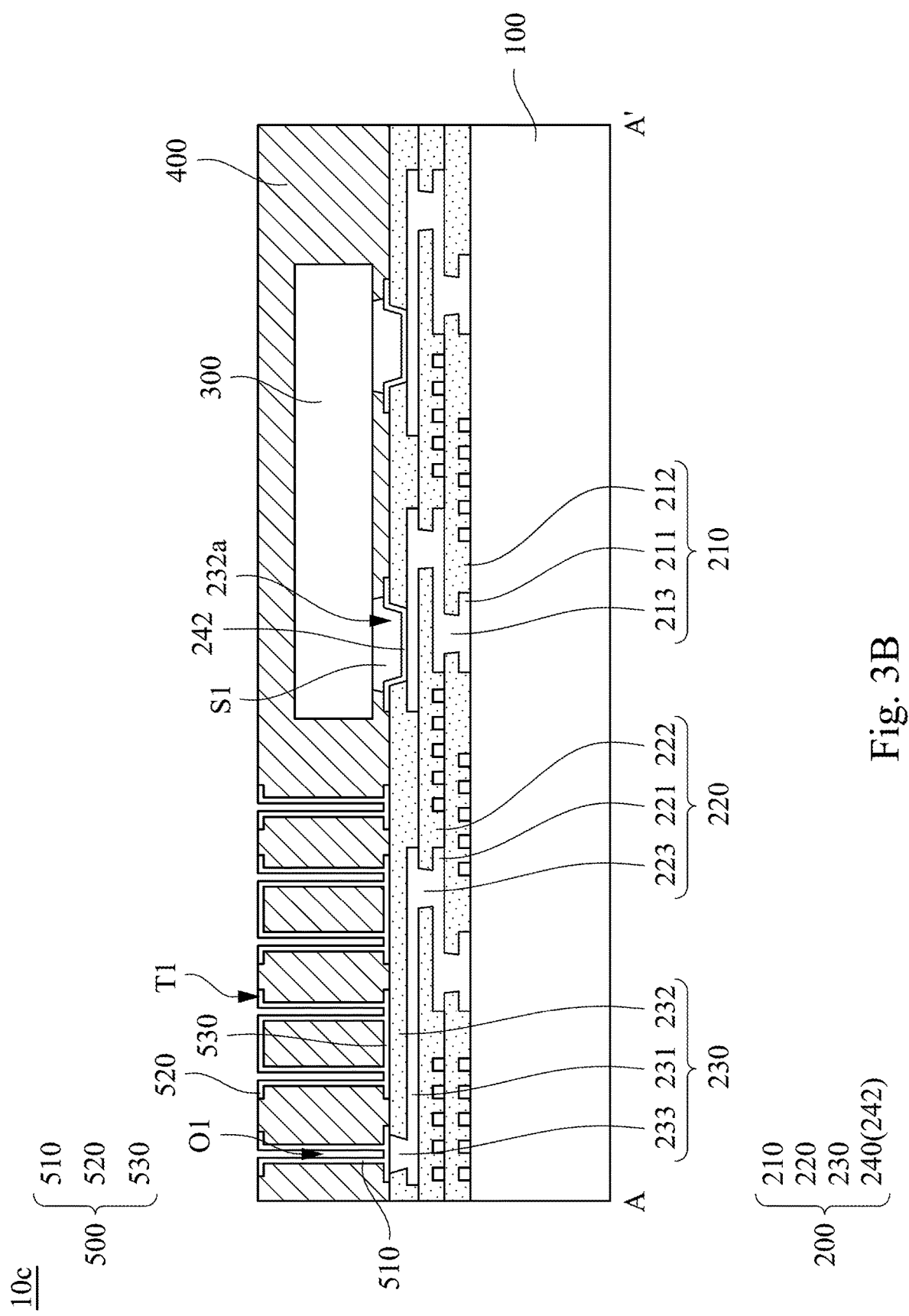
FIG. 3B is a schematic sectional view along a cutting line A-A' of FIG. 3A.

FIG. 3A depicts a schematic top view of a chip packaging structure 10c according to one embodiment of the present disclosure. FIG. 3B depicts a schematic sectional view of the chip packaging structure 10c along a cutting line A-A' of FIG. 3A. It is noted that in FIG. 3A and FIG. 3B, the same or similar elements as those in FIG. 2A and FIG. 2B are given the same symbols, and the related description is omitted. The chip packaging structure 10c in FIG. 3A and FIG. 3B is similar to the chip packaging structure 10b in FIG. 2A and FIG. 2B, and differences between them include a sealing layer 400 of the chip packaging structure 10c having at least one groove T1 and an antenna pattern 500 of the chip packaging structure 10c further including a third portion 520 which fills the groove T1.

It is noted that compared with the chip packaging structure 10b, in the chip packaging structure 10c, an area of the third portion 520 of the antenna pattern 500 that is formed in the groove T1 is increased. Therefore, the signal strength is increased.

The present disclosure also provides a method of manufacturing the chip packaging structure 10c. The difference between the methods of manufacturing the chip packaging structure 10b in FIG. 2A-FIG. 2B and manufacturing the chip packaging structure 10c includes forming a second opening O1 exposing the first portion 530 of the antenna pattern 500 and a groove T1 communicating with the second opening O1 by a laser direct structuring process. Therefore, after a chemical deposition process, a metal material is deposited on sidewalls of the second opening O1 and is deposited in the groove T1, such that the second portion 510 and the third portion 520 of the antenna pattern 500 are formed.

Figure 4A:
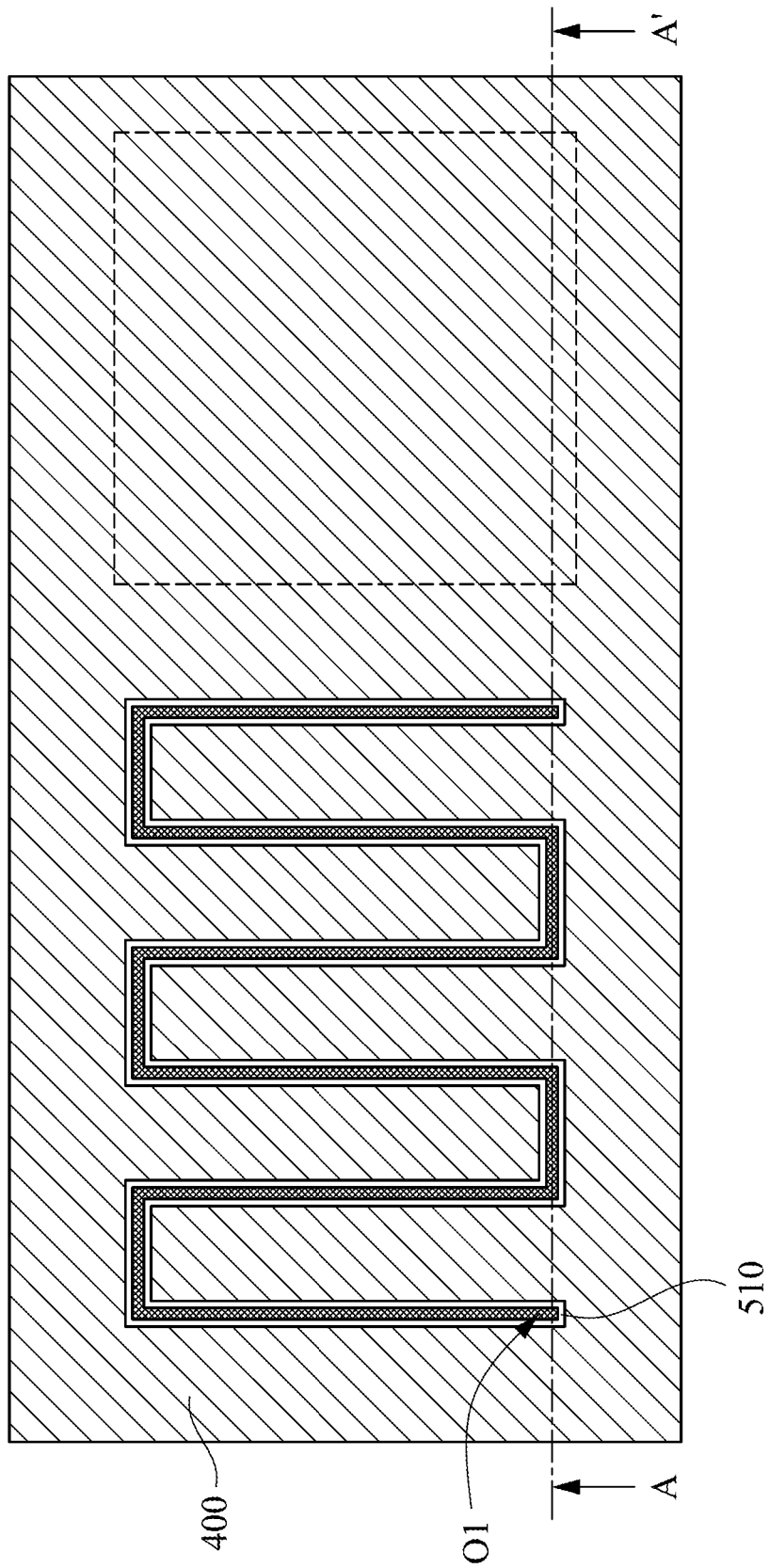
FIG. 4A is a schematic top view of a chip packaging structure according to one embodiment of the present disclosure.
Figure 4B:
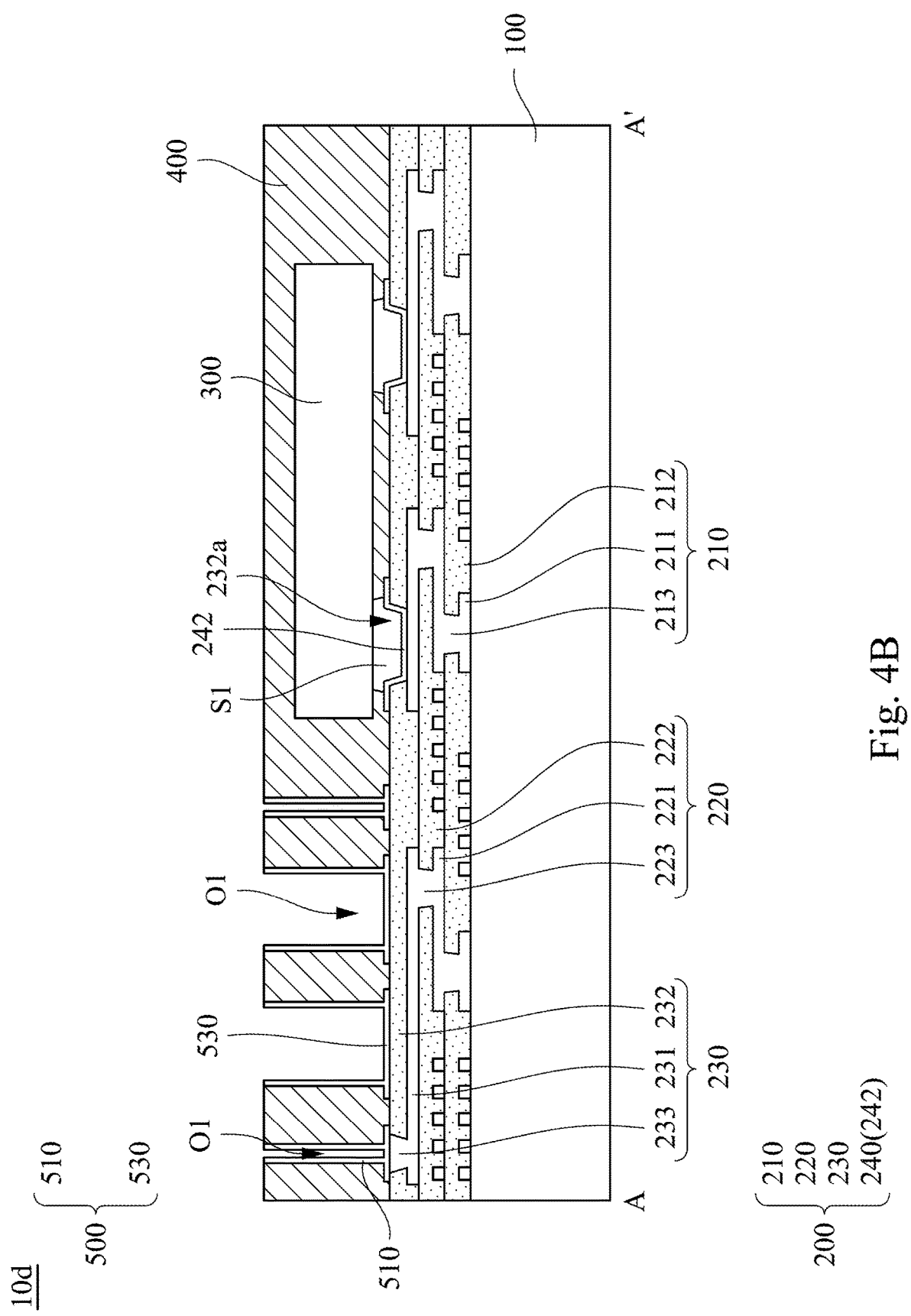
FIG. 4B is a schematic sectional view along a cutting line A-A' of FIG. 4A.

FIG. 4A depicts a schematic top view of a chip packaging structure 10d according to one embodiment of the present disclosure. FIG. 4B depicts a schematic sectional view of the chip packaging structure 10d along a cutting line A-A' of FIG. 4A. It is noted that in FIG. 4A and FIG. 4B, the same or similar elements as those in FIG. 2A and FIG. 2B are given the same symbols, and the related description is omitted. The chip packaging structure 10d in FIG. 4A and FIG. 4B is similar to the chip packaging structure 10b in FIG. 2A and FIG. 2B, and a difference between them includes a second opening O1 of the chip packaging structure 10d being a trench (as shown in FIG. 4A).

Specifically, a shape of the trench corresponds to a shape of the first portion 530 of the antenna pattern 500, and the trench exposes the first portion 530 of the antenna pattern 500. Consequently, an area of the second portion 510 of the antenna pattern 500 that is formed on the sidewalls of the trench is increased. Therefore, the signal strength is increased.

Figure 5A:
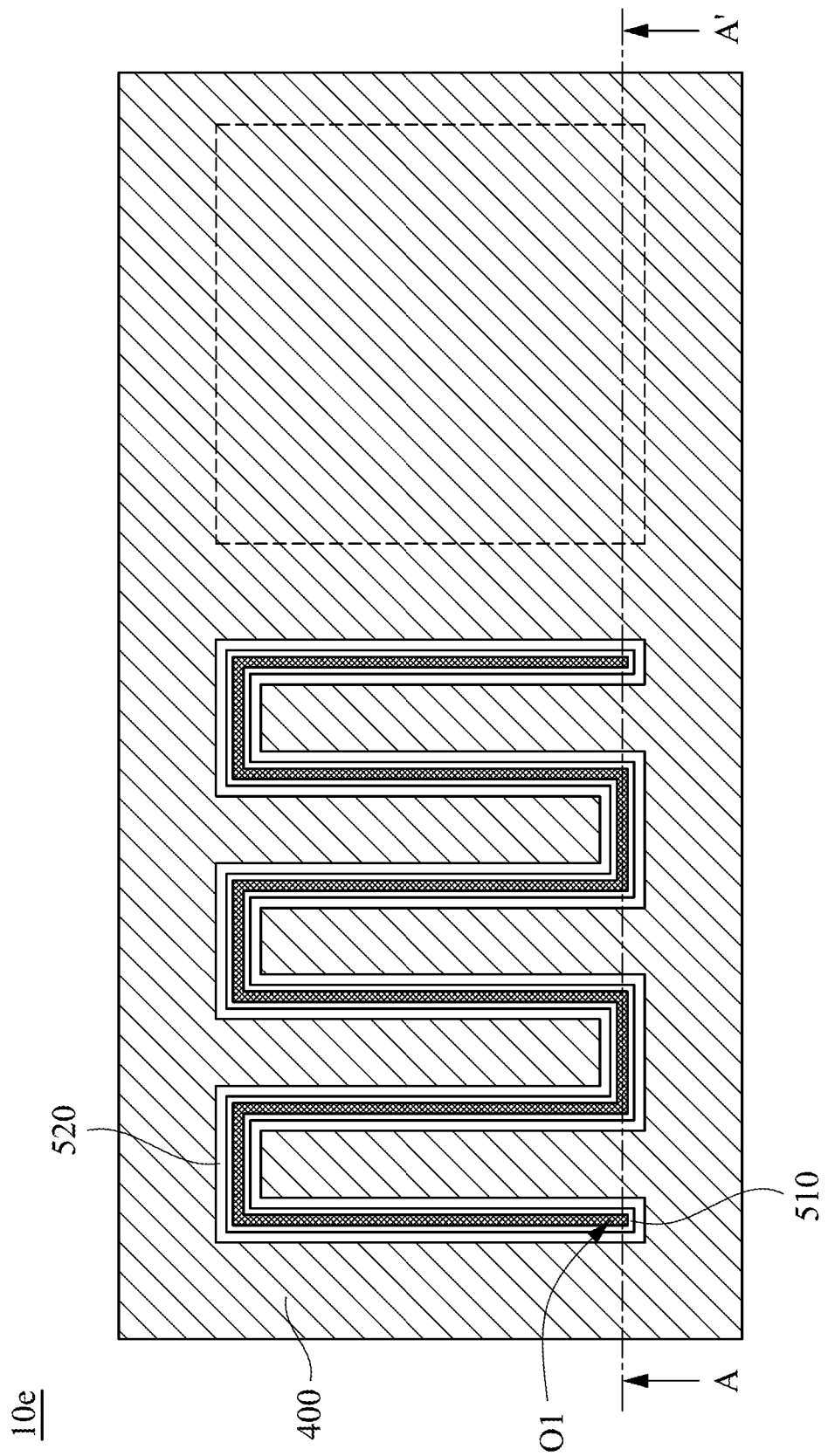
FIG. 5A is a schematic top view of a chip packaging structure according to one embodiment of the present disclosure.
Figure 5B:
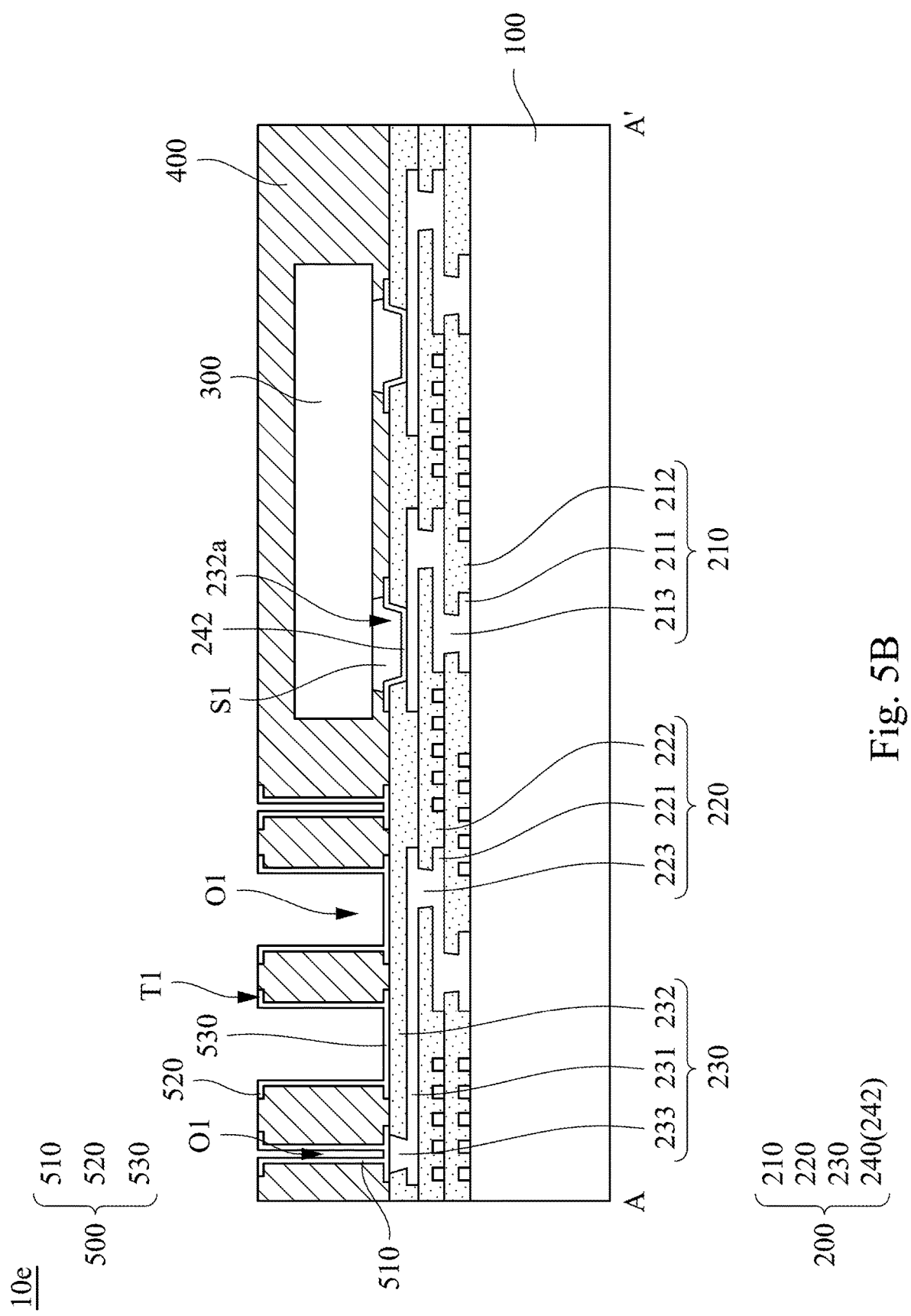
FIG. 5B is a schematic sectional view along a cutting line A-A' of FIG. 5A.

FIG. 5A depicts a schematic top view of a chip packaging structure 10e according to one embodiment of the present disclosure. FIG. 5B depicts a schematic sectional view of the chip packaging structure 10e along a cutting line A-A' of FIG. 5A. It is noted that in FIG. 5A and FIG. 5B, the same or similar elements as those in FIG. 3A and FIG. 3B are given the same symbols, and the related description is omitted. The chip packaging structure 10e in FIG. 5A and FIG. 5B is similar to the chip packaging structure 10c in FIG. 3A and FIG. 3B, and a difference between them includes a second opening O1 of the chip packaging structure 10e being a trench (as shown in FIG. 5A). Consequently, similarly, an area of the second portion 510 of the antenna pattern 500 that is formed on the sidewalls of the trench is increased. Therefore, the signal strength is increased.

It is noted that the first circuit layer 211 in each of the chip packaging structures 10a-10e may serve as an antenna and receives a signal through the protecting substrate 100 (for example, a glass substrate). Therefore, according to some embodiments, the chip packaging structures 10a-10e may be turned upside down, and the first circuit layer 211 in chip packaging structures 10a-10e may serve as an antenna.

Figure 6A:
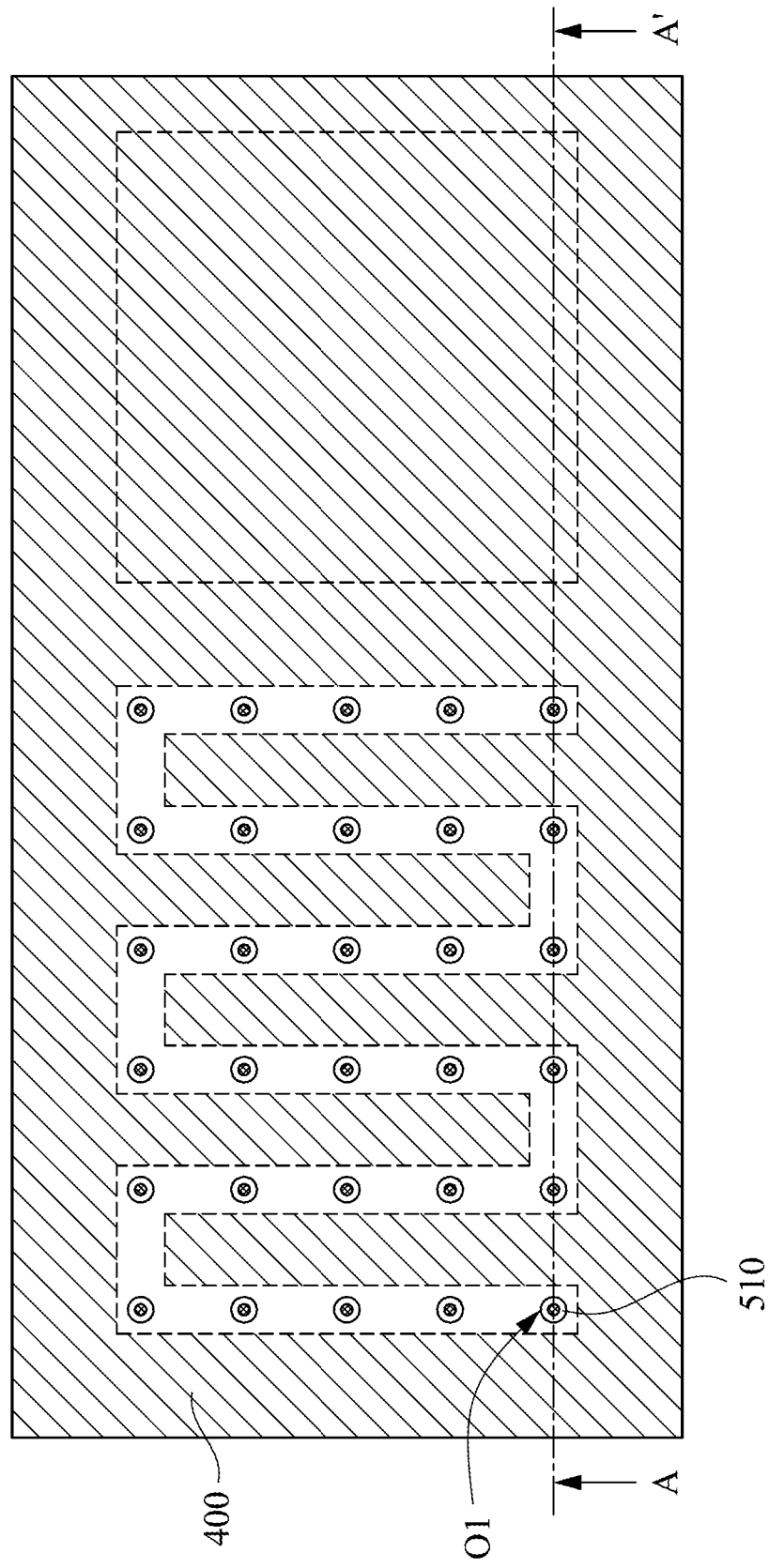
FIG. 6A is a schematic top view of a chip packaging structure according to one embodiment of the present disclosure.
Figure 6B:
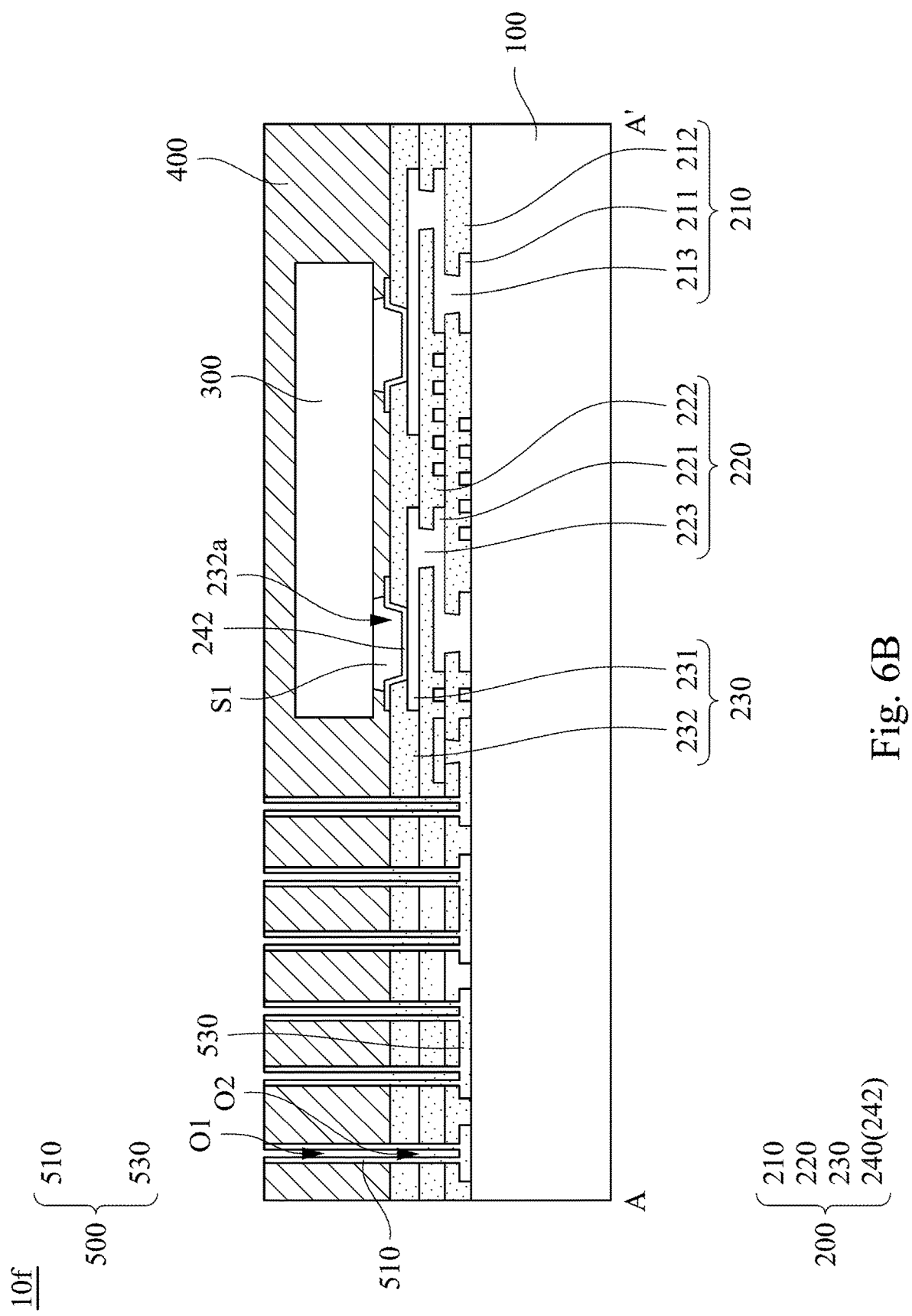
FIG. 6B is a schematic sectional view along a cutting line A-A' of FIG. 6A.

FIG. 6A depicts a schematic top view of chip packaging structure 10f according to one embodiment of the present disclosure. FIG. 6B depicts a schematic sectional view of the chip packaging structure 10f along a cutting line A-A' of FIG. 6A. It is noted that in FIG. 6A and FIG. 6B, the same or similar elements as those in FIG. 2A and FIG. 2B are given the same symbols, and the related description is omitted. The chip packaging structure 10f in FIG. 6A and FIG. 6B is similar to the chip packaging structure 10b in FIG. 2A and FIG. 2B, and differences between them include an opening O2 presenting in a circuit redistribution structure 200 of the chip packaging structure 10f and communicating with a second opening O1 of the sealing layer 400.

In addition, a first portion 530 of an antenna pattern 500 of the chip packaging structure 10f is disposed on a protecting substrate 100 and is covered by the circuit redistribution structure 200. The first portion 530 is electrically connected to a second circuit layer 221 through a first conductive contact member 213. A second portion 510 of the antenna pattern 500 is disposed on sidewalls of the opening O2 and sidewalls of the second opening O1, and a bottom of the second portion 510 is in contact with and electrically connected to the first portion 530.

It is noted that the first portion 530, which is disposed on the protecting substrate 100, of the antenna pattern 500 may provide some technical effects. Specifically, a surface of the protecting substrate 100 is usually flatter than a surface of the circuit redistribution structure 200. Therefore, compared with the first portion 530 of the chip packaging structure 10b, in which the first portion 530 is formed on the circuit redistribution structure 200, the first portion 530 that is formed on the protecting substrate 100 is relatively flatter and therefore can be used in any devices that requires an flatter antenna pattern (for example, a high-frequency device).

The present disclosure also provides a method of manufacturing the chip packaging structure 10f. The difference between the methods of manufacturing the chip packaging structure 10b in FIGS. 2A-2B and manufacturing the chip packaging structure 10f includes forming a first portion 530 of the antenna pattern 500 over the protecting substrate 100 simultaneously during the formation of a first circuit layer 211. For example, a conductive material on the protecting substrate 100 is patterned to form a first circuit layer 211 and the first portion 530 of the antenna pattern 500. In addition, the first dielectric layer 212 further includes another via exposing the first portion 530. The first conductive contact member 213 is filled in the via as well, such that the first conductive contact member 213 is in contact with and electrically connecting the first portion 530 and the second circuit layer 221.

Moreover, after the third dielectric layer 232 is formed, only the second conductive pad 242 is formed. Consequently, a circuit redistribution precursor structure is formed on the protecting substrate 100. After the chip 300 is disposed, a sealing material is formed and covers the chip 300 and the circuit redistribution precursor structure. Next, the sealing material and the circuit redistribution precursor structure are patterned by a laser direct structuring process to form a sealing layer 400 having at least one second opening O1 and a circuit redistribution structure 200 having at least one opening O2. Subsequently, the second portion 510 of the antenna pattern 500 is formed on sidewalls of the openings O1 and O2 by a chemical deposition process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a chip packaging structure, comprising steps of:
   (i) providing a formed body, wherein the formed body comprises a circuit redistribution structure and a chip disposed over the circuit redistribution structure, and the circuit redistribution structure comprises:
   a first circuit redistribution layer comprising a first circuit layer;
   a second circuit redistribution layer disposed on the first circuit redistribution layer, wherein the second circuit redistribution layer comprises a second circuit layer electrically connected to the first circuit layer and the chip; and
   a conductive pad electrically connected to the second circuit layer;
   (ii) forming a sealing material covering the chip and the circuit redistribution structure;
   (iii) patterning the sealing material to form a sealing layer, wherein the sealing layer has an opening and a groove, the opening exposes the conductive pad, and a portion of the groove is communicated with the opening; and
   (iv) forming an antenna pattern, wherein the antenna pattern comprises:
   a first portion covering a sidewall of the opening and electrically connected with the conductive pad, wherein the first portion does not fill the opening such that the opening still exposes the conductive pad; and
   a second portion filling the groove and electrically connect with the first portion.

2. The method of claim 1, wherein the step (iii) is performed by a laser process of direct formation.

3. A method of manufacturing a chip packaging structure, comprising steps of:
   (i) providing a formed body, wherein the formed body comprises a circuit redistribution structure and a chip disposed over the circuit redistribution structure, and the circuit redistribution structure comprises:
   a first circuit redistribution layer comprising a first circuit layer; and
   a second circuit redistribution layer disposed on the first circuit redistribution layer, wherein the second circuit redistribution layer comprises a second circuit layer electrically connected to the first circuit layer and the chip;
   (ii) forming a first portion of an antenna pattern on the circuit redistribution structure;
   (iii) forming a sealing material covering the first portion of the antenna pattern, the chip, and the circuit redistribution structure;
   (iv) patterning the sealing material to form a sealing layer, wherein the sealing layer has an opening exposing the first portion of the antenna pattern; and
   (v) forming a second portion of the antenna pattern on at least one sidewall of the opening, wherein the second portion does not fill the opening such that the opening still exposes the first portion, and is electrically connected to the first portion.

4. The method of claim 3, wherein the step (iii) is performed by a laser process of direct formation.

5. The method of claim 3, wherein the sealing layer in the step (iv) further comprises a groove, and a portion of the groove communicates with the opening; wherein the step (v) further comprises forming a third portion of the antenna pattern in the groove, and the third portion is electrically connected to the second portion.

6. A method of manufacturing a chip packaging structure, comprising steps of:
- (i) providing a formed body, wherein the formed body comprises a protecting substrate, a first portion of an antenna pattern disposed over the protecting substrate, a circuit redistribution precursor structure disposed on the protecting substrate, and a chip disposed over the circuit redistribution precursor structure, and the circuit redistribution precursor structure comprises:
  a first circuit layer; and
  a second circuit layer disposed on the first circuit layer and electrically connected to the first circuit layer, the first portion of the antenna pattern, and the chip;
- (ii) forming a sealing material covering the chip and the circuit redistribution precursor structure;
- (iii) patterning the circuit redistribution precursor structure and the sealing material to form a circuit redistribution structure and a sealing layer, wherein the circuit redistribution structure has a first opening exposing the first portion of the antenna pattern, and the sealing layer comprises a second opening communicating with the first opening; and
- (iv) forming a second portion of the antenna pattern on a one sidewall of the first opening and a sidewall of the second opening, wherein the second portion does not fill the first opening and the second opening such that the first opening still exposes the first portion, and is electrically connected to the first portion.

7. The method of claim 6, wherein the step (iii) is performed by a laser process of direct formation.

* * * * *